United States Patent
Albo et al.

(10) Patent No.: US 8,513,644 B2
(45) Date of Patent: Aug. 20, 2013

(54) STRAIN-CONTROLLED ATOMIC LAYER EPITAXY, QUANTUM WELLS AND SUPERLATTICES PREPARED THEREBY AND USES THEREOF

(71) Applicant: Technion Research & Development Foundation Ltd., Haifa, IL (US)

(72) Inventors: Asaf Albo, Haifa (IL); Gad Bahir, Haifa (IL); Dan Fekete, Zikhron-Yaakov (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 13/656,852

(22) Filed: Oct. 22, 2012

(65) Prior Publication Data

US 2013/0075694 A1    Mar. 28, 2013

Related U.S. Application Data

(62) Division of application No. 12/789,481, filed on May 28, 2010, now Pat. No. 8,293,628.

(60) Provisional application No. 61/181,679, filed on May 28, 2009, provisional application No. 61/181,680, filed on May 28, 2009.

(51) Int. Cl.
*H01L 33/04* (2010.01)

(52) U.S. Cl.
USPC ........ 257/13; 257/E33.008; 438/508; 438/20; 438/962

(58) Field of Classification Search
USPC ............. 257/13, E33.008; 438/20, 508, 962; 117/89; 977/891, 755
See application file for complete search history.

(56) References Cited

U.S. PATENT DOCUMENTS

| | | | |
|---|---|---|---|
| 5,155,571 A | 10/1992 | Wang et al. | |
| 6,603,784 B1 | 8/2003 | Johnson | |
| 6,975,660 B2 | 12/2005 | Johnson | |
| 7,109,526 B2 | 9/2006 | Gentner et al. | |
| 7,256,417 B2 | 8/2007 | Mawst et al. | |
| 7,391,507 B2 | 6/2008 | Chism, II | |
| 7,457,338 B2 | 11/2008 | Mawst et al. | |
| 7,737,411 B2 | 6/2010 | Gunapala et al. | |
| 7,768,048 B2 | 8/2010 | Ueno et al. | |
| 8,003,434 B2 | 8/2011 | Maimon | |
| 8,154,008 B2 | 4/2012 | Lee et al. | |
| 2004/0259284 A1 | 12/2004 | Lin | |
| 2005/0017176 A1 | 1/2005 | Koch et al. | |
| 2005/0056868 A1 | 3/2005 | Gentner et al. | |
| 2005/0170542 A1 | 8/2005 | Matsumura | |
| 2005/0173694 A1 | 8/2005 | Mawst et al. | |
| 2007/0009001 A1 | 1/2007 | Shigihara et al. | |
| 2007/0215900 A1 | 9/2007 | Maimon | |
| 2007/0221908 A1 | 9/2007 | Takahashi et al. | |
| 2007/0228358 A1 | 10/2007 | Ofek | |
| 2007/0248135 A1 | 10/2007 | Mawst et al. | |

(Continued)

OTHER PUBLICATIONS

Notice of Allowance Dated Oct. 2, 2012 From the US Patent and Trademark Office Re. U.S. Appl. No. 13/031,302.

(Continued)

*Primary Examiner* — Jami M Valentine

(57) ABSTRACT

Processes for forming quantum well structures which are characterized by controllable nitride content are provided, as well as superlattice structures, optical devices and optical communication systems based thereon.

20 Claims, 4 Drawing Sheets

(56) References Cited

U.S. PATENT DOCUMENTS

| | | | |
|---|---|---|---|
| 2008/0112452 | A1 | 5/2008 | Chakraborty et al. |
| 2010/0072457 | A1 | 3/2010 | Iguchi et al. |
| 2010/0118905 | A1 | 5/2010 | Yabushita et al. |
| 2010/0295095 | A1 | 11/2010 | Klipstein |
| 2010/0308300 | A1* | 12/2010 | Pan ................................ 257/13 |
| 2011/0204214 | A1 | 8/2011 | Bahir et al. |

OTHER PUBLICATIONS

Notice of Allowance Dated Jun.22, 2012 From the US Patent and Trademark Office Re. U.S. Appl. No. 12/789,481.
Official Action Dated Sep. 18, 2012 From the US Patent and Trademark Office Re. U.S. Appl. No. 12/789,479.
Restriction Official Action Dated Feb. 22, 2012 From the US Patent and Trademark Office Re. U.S. Appl. No. 12/789,481.
Bank et al. "Recent Progress on 1.55-?m Dilute-Nitride Lasers", IEEE Journal of Quantum Electronics, 43(9): 773-785, Sep. 2007.
Bedair "Atomic Layer Epitaxy Deposition Processes", Journal of Vacuum Science & Technology B, 12(1): 179-185, Jan./Feb. 1994.
Gendron et al. "Quantum Cascade Photodetector", Applied Physics Letters, 85(14): 2824-2826, Oct. 4, 2004.
Klipstein "'XBn' Barrier Photodetectors for High Sensitivity and High Operating Temperature Infrared Sensors", Proceedings of SPIE, the International Society of Optical Engineering, 34th Conference on Infrared Technology and Applications, Orlando, FL, USA, Mar. 17-20, 2008, 6940(2): 69402U.1- 69402U.12, 2008.
Maimon et al. "NBn Detector, An Infrared Detector With Reduced Dark Current and Higher Operating Temperature", Applied Physics Letters, 89: 151109-1-151109-3, 2006.
Mawst et al. "MOCVD-Grown Dilute Nitride Type II Quantum Wells", IEEE Journal of Selected Topics in Quantum Electronics, 14(4): 979-991, Jul./Aug. 1008.
Peter et al. "Realization and Modeling of a Pscudomorphic (GaAs1-xSbx-InyGal-yAs)/GaAs Bilayer-Quantum Well", Applied Physics Letters, 67(18): 2639-2641, Oct. 30, 1995.
Shields et al. "Detection of Single Photons Using a Field-Effect Transistor Gated by a Layer of Quantum Dots", Applied Physics Letters, 76(25): 3673-3675, Jun. 19, 2000.
Yoon et al. "Self-Assembled GaInNAs/GaAsN Quantum Dot Lasers: Solid Source Molecular Beam Epitaxy Growth and High-Temperature Operation", Nanoscale Research Letters, 1: 20-31, 2006.
Office Action Dated Dec. 26, 2012 From the Israel Patent Office Re. Application No. 204083 and Its Translation Into English.
Notice of Allowance Dated Mar. 26, 2013 From the US Patent and Trademark Office Re. U.S. Appl. No. 13/031,293.
Official Action Dated Apr. 29, 2013 From the US Patent and Trademark Office Re. U.S. Appl. No. 12/789,479.

* cited by examiner

STRAIN-CONTROLLED ATOMIC LAYER EPITAXY, QUANTUM WELLS AND SUPERLATTICES PREPARED THEREBY AND USES THEREOF

RELATED APPLICATIONS

This application is a divisional of U.S. patent application Ser. No. 12/789,481 filed on May 28, 2010, which claims the benefit of priority of U.S. Provisional Patent Application Nos. 61/181,679 and 61/181,680 both filed on May 28, 2009. The contents of the above applications are all incorporated herein by reference.

FIELD AND BACKGROUND OF THE INVENTION

The present invention, in some embodiments thereof, relates to semiconductors, and more particularly, but not exclusively, to high-indium content quantum wells having controllable nitrogen content, processes of preparing same by atomic layer epitaxy, superlattices containing same and uses thereof.

Conventional double heterostructure (DH) junctions are generally fabricated from the GaAs—(In/Al)GaAs materials system and include a pair of wide bandgap layers, such as (In/Al)GaAs, of opposite conductivity type and an active region, such as GaAs, sandwiched therebetween. The interfaces between the active region and the wide bandgap layers form a pair of heterojunctions which provide both optical and charge carrier confinement. From the standpoint of quantum effects, when the active region of a DH junction is thicker than 500 Angstroms, the discrete energy levels associated with confined electrons are so closely spaced that quantum effects are negligible. When the passive layers are thin enough (less than about 500 Angstroms), the carriers are able to distribute themselves among the active layers, and when the active layers are thin enough (less than about 500 Angstroms), the confined carriers are characterized by discrete energy levels.

A quantum well is therefore a double heterostructure potential well that confines particles, which were originally free to move in three dimensions, to two dimensions, forcing them to occupy a planar region. The effects of quantum confinement take place when the quantum well thickness becomes comparable at the wavelength of the charge carriers, namely electrons and holes, leading to energy levels called "energy subbands", wherein the energy of the carriers has discrete values. Quantum wells structures are generally grown by molecular beam epitaxy or chemical vapor deposition with control of the layer thickness down to monolayers, as disclosed originally in U.S. Pat. No. 3,982,207.

In recent years, the GaInAs dilute nitride alloy has been the subject of intense theoretical and experimental research due to its unique physical properties, making it highly suitable for forming quantum wells and other structures. The possibility of varying the lattice constant and band-gap energy of GaInAs nitride alloy (GaInAsN) over a wide range by optimizing the nitrogen content [Henini, M., *Dilute Nitride Semiconductors*, Elsevier, Oxford, 2005] provides an opportunity to tailor the material's properties for a desired optoelectronic device application, such as near-infrared (IR) lasers emitting in the optical fiber communication wavelength window [see, for example, U.S. Pat. Nos. 7,109,526 7,256,417 and 7,457,338 and U.S. Patent Application Publication Nos. 2005-0056868 2005-0173694 and 2007-0248135], and quantum-well IR photodetector (QWIP) devices with wavelengths shorter than 4 μm [Albo, A. et al., *App. Phys. Lett.*, 94, 093503, 2009].

However, the growth of high-indium-content dilute-nitride GaInAsN/GaAs structures using metal organic chemical vapor deposition (MOCVD) is still a challenging industrial process. One of the challenges in growing GaInAsN quantum-well (QW) lasers using MOCVD is the difficulty of incorporating nitrogen atoms into GaInAs quantum wells. The rate of incorporation of nitrogen is markedly reduced in high-indium-content quantum wells due to the weak In—N bonds which cannot compete with the rate of desorption of nitrogen from the surface during growth [Saito, H. et al., J. of Crystal Growth, 195, 416, 1998], and low growth temperatures combined with a high dimethylhydrazine (DMH or DMHy) molar fraction ratio are needed to incorporate a reasonable amount of nitrogen. On the other hand, growth at low temperatures results in a poor crystal quality [Hakkarainen, T. et al., *J. Phys: Condens. Matter.*, 16, 53009, 2004].

Atomic layer epitaxy (ALE) is a chemical process by which conformal thin-films of materials (precursors) are deposited sequentially onto various substrates. ALE is unique and different from conventional chemical vapor deposition (CVD), molecular beam or hot-wall epitaxy methods, mainly in the order and manner in which the different substances are introduced into the system. In ALE the substances are introduced individually, one at a time (cycle) and the system is purged between cycles. The method is also different then other deposition methods by being self-limiting, namely the amount of the film material deposited in each reaction cycle is constant rather than being dependent on precursor concentration and exposure time. Thus, the ALE reaction splits the CVD reaction into two half-reactions or more, keeping each of the precursor materials temporally separate during the reaction. Due to the characteristics of self-limiting and surface reactions, ALE film growth makes atomic scale deposition highly controllable. Separation of the precursors is accomplished by pulsing a purge gas (typically nitrogen or argon) after each precursor pulse to remove excess precursor from the process chamber and prevent 'parasitic' CVD events occurring on the substrate. By keeping the precursors separate throughout the coating process, atomic layer control of film growth can be maximized, affording conformal films of uniform thickness.

ALE can be used to deposit several types of thin films, including elemental metals, metal oxides, metal nitrides and metal sulfides. The growth of material layers by ALE consists of preparing the surface, typically by heat, and repeating a cycle of four basic steps starting with exposure of the first precursor; purge or evacuation of the reaction chamber to remove the non-reacted precursors and the gaseous reaction by-products; exposure of the second precursor or another treatment to activate the surface again for the reaction of the first precursor; and purge or evacuation of the reaction chamber. Each monolayer growth cycle adds a given amount of material to the surface, referred to as the growth per cycle. To grow a material layer, reaction cycles are repeated as many as required for the desired film thickness, while a growth cycle may span from half a second to a few seconds and deposit between 0.1 and 3 Å of film thickness.

In contrast to QW prepared by conventional MOCVD, high-quality layers growth of InAs, GaAs and GaInAs can be obtained at relatively low temperatures ALE using III-V group elements [Tischler, M. A. et al., *Appl. Phys. Lett.*, 49, 1199, 1986 and Bedair, S. M. et al., *J. Sci. Technol. B*, 12, 179, 1994]. During the ALE process, the III and V atomic sources are alternately and separately introduced into the reactor. This process enables monolayer growth per cycle without the elemental sources interacting, while in conventional growth, all the elements arrive at the substrate simultaneously.

Ishida, A. et al. reported a series of AlN/GaN short-period superlattices with MN monolayer, prepared by hot-wall epitaxy [Physica E: Low-dimensional Systems and Nanostructures, 13, 2-4, pp. 1098-1101, 2002]. Janga, Y. D. et al. report InAsN quantum dots (QD) on GaAs with an intense and narrow photoluminescence peak at 1.3 μm [Janga, Y. D. et al., *Physica E*, 17, pp. 127-128, 2003]. Yoon, S. F. et al. report InNAs and GaInNAs self-assembled quantum dots and lasers grown by solid source molecular beam epitaxy [Yoon, S. F. et al., Nanoscale Research Letters, 1, 1, pp 20-31, 2006]. Kuroda, M. et al. report of growth and characterization of InAsN alloy films and quantum wells [Kuroda, M. et al., *Journal of Crystal Growth*, 278, 1-4, pp. 254-258, 2005]. GeM, C. H. et al., suggested the superlattice structure approach and disclosed theoretical performance of InAs/InGaSb superlattice-based midwave infrared lasers [*J. Appl. Phys.*, 76, pp 1940-1942, 1994]. Hasenberg, T. C. et al., demonstrated a 3.5 pm GaInSb/InAs superlattice diode laser [*Electronics Letters*, 31, 275-276, 1995]. Khandekar, A. A. et al., reported a type II superlattice dilute-nitride laser structure and characteristics of GaAsN/GaAsSb type-II quantum wells grown by metalorganic vapor phase epitaxy on GaAs substrates [*J. Appl. Phys.*, 98, 12, p. 123525, 2005]. Additional background art can be found, for example, in U.S. Pat. Nos. 5,155,571, 7,391,507 and U.S. Patent Application Publication No. 2010-0118905.

SUMMARY OF THE INVENTION

The present invention, in some embodiments thereof, relates to semiconductors, and more particularly, but not exclusively, to high-indium content quantum wells having controllable nitrogen content, processes of preparing same by atomic layer epitaxy, superlattices containing same and uses thereof.

The present inventors have devised an experimentally-proven process using lattice strain to incorporate nitrogen atoms into indium-arsenide monolayers during the atomic layer epitaxy growth thereof, so as to form InAsN monolayers on gallium-arsenide (GaAs). Photoluminescence and secondary ion mass spectroscopy measurements indicated that the nitrogen was incorporated in the grown layers. According to some embodiments of the present invention, utilizing this new strain-controlled atomic layer epitaxy technique affords a highly strained InAsN/GaAs short-period superlattice (SPSL) structure suitable for applications such as optical communication.

According to some embodiments of the present invention, a model of a strain-induced incorporation of nitrogen atoms during ALE growth, where a full atomic layer of N is nearly completely replaced at a later stage by As atoms, is proposed and experimentally verified herein, while the remaining N content is a function of strain in the grown layer. According to some embodiments of the present invention, a strain-controlled ALE growth of InAsN quantum wells is implemented in a high-indium-content (Ga)InAsN structure grown using ALE, which is suitable for optical communication wavelengths.

Hence, according to an aspect of some embodiments of the present invention there is provided a process of forming a quantum well structure which includes a base-layer, a well-layer which includes a group-III element, a group-V element and nitrogen, and a cap-layer, the process comprising:

epitaxially growing the base-layer on a substrate;
epitaxially growing the well-layer on the base-layer; and
epitaxially growing the cap-layer on the well-layer,
thereby forming the quantum well structure,
wherein the epitaxially growing the well-layer includes:
exposing the base-layer to a precursor of a group-III element, to thereby form on the base-layer a first atomic layer which includes the group-III element deposited thereon;
terminating the exposing to the precursor of a group-III element;
exposing the base-layer having the first atomic layer to a precursor of nitrogen, to thereby form the base-layer having the first atomic layer deposited thereon and the nitrogen absorbed onto the first atomic later;
terminating the exposing to the precursor of nitrogen;
exposing the base-layer to a precursor of a group-III element, to thereby form on the base-layer a second atomic layer which includes the group-III element;
terminating the exposing to the precursor of the group-III element; and
exposing the base-layer having the first atomic layer, the nitrogen and the second atomic layer deposited thereon, to a precursor of a group-V element, to thereby form the well-layer.

In some embodiments, forming the first and/or the second atomic layers is effected so as to form the well-layer as a multi-monolayer well-layer.

In some embodiments, the well-layer is a two-monolayer.

In some embodiments, the number of atoms of the group-III element is at least 50 percent of the total number of atoms of the well-layer.

In some embodiments, the number of nitrogen atoms ranges from 0.1 percent to 5 percents of the total number of atoms of the well-layer.

In some embodiments, the number of nitrogen atoms ranges from 1 percent to 3 percents of the total number of atoms of the well-layer.

In some embodiments, the strain in the first atomic layer is greater than 2%.

In some embodiments, the strain in the first atomic layer is greater than 7%.

In some embodiments, exposing the base-layer to the precursor of the group-III element is performed for a time period that ranges from 5 second to 50 seconds.

In some embodiments, the time period that ranges from 6 second to 10 seconds.

In some embodiments, the time period is 7 seconds.

In some embodiments, epitaxially growing the well-layer onto the base-layer in the reaction chamber is performed at a temperature not higher than 520° C.

In some embodiments, each of the base-layer and the cap-layer independently which includes a substance selected from the group consisting of GaAs, GaAsSb, GaAsSbN, AlGaAs, GaAsP, GaInAs, GaSb and GaSbN.

In some embodiments, epitaxially growing the cap-layer is performed at a temperature not higher than 520° C.

In some embodiments, the process further includes, subsequent to epitaxially growing the cap-layer, epitaxially growing an additional well-layer which includes the group-III element, the group-V element and nitrogen onto the cap-layer.

In some embodiments, the process further includes, subsequent to epitaxially growing the additional well-layer, epitaxially growing an additional cap-layer on the additional well-layer.

In some embodiments, the process further includes, subsequent to epitaxially growing the cap-layer, epitaxially growing onto the cap-layer, sequentially, a plurality of additional well-layers, each independently includes a group-III element, a group-V element and nitrogen, and a plurality of additional cap layers.

In some embodiments, the group-III element is selected from the group consisting of gallium, indium, thallium and aluminum.

In some embodiments, the group-V element is selected from the group consisting of arsenic, antimony and phosphorous.

In some embodiments, the precursor of nitrogen is selected from the group consisting of dimethylhydrazine (DMH), ammonia, hydrazine, monomethylhydrazine, t-butylhydrazine, phenylhydrazine, t-butylamine and nitrogen trifluoride.

In some embodiments, the group-III element is indium and the precursor of the group-III element is trimethylindium ($In(CH_3)_3$).

In some embodiments, the group-III element is gallium and the precursor of the group-III element is trimethylgalium ($Ga(CH_3)_3$).

In some embodiments, the group-V element is arsenic and the precursor of the group-III element is arsine ($ArH_3$), t-butylarsine (t-$BuAsH_2$), and tri-t-butylarsine.

According to another aspect of some embodiments of the present invention there is provided a quantum well structure which includes a base-layer and a well-layer, which includes a group-III element, a group-V element and nitrogen, a cap layer, wherein the quantum well structure is produced by the process presented herein.

According to another aspect of some embodiments of the present invention there is provided a quantum well structure which includes a base-layer and a well-layer, which includes a group-III element, a group-V element and nitrogen and a cap layer.

In some embodiments, a peak of a photoluminescent (PL) spectrum obtained therefrom is wider than a peak of a photoluminescent (PL) spectrum obtained from a quantum well which comprises the base-layer and a well-layer which comprises the group-III element and the group-V element and is devoid of nitrogen, and the cap layer, by at least 5%.

In some embodiments, the peak of the photoluminescent (PL) spectrum obtained therefrom is wider than the peak of the photoluminescent (PL) spectrum obtained from the quantum well which comprises the base-layer and the well-layer which comprises the group-III element and the group-V element and is devoid of nitrogen, and the cap layer, by less than 100%.

In some embodiments, a number of atoms of the group-III element is at least 50 percents of the total number of atoms of the well-layer.

In some embodiments, a number of nitrogen atoms ranges from 0.1 percent to 5 percents of the total number of atoms of the well-layer.

In some embodiments, the quantum well structure presented herein forms a part of a superlattice structure having a plurality of periods, each period independently comprising the well-layers and the cap-layer, as described herein.

In some embodiments, the number of periods in the superlattice structure ranges from 2-6.

In some embodiments, the superlattice structure is configured as an optical device.

In some embodiments, the optical device characterized by a concerted emission of radiation in a wavelength that ranges from 1.3 µm to 1.6 µm.

According to an aspect of some embodiments of the present invention, there is provided a superlattice structure which includes at least one of the quantum-well structures presented herein.

According to an aspect of some embodiments of the present invention, there is provided a superlattice structure which includes at least two periods, each period independently includes a well-layer which includes a group-III element, a group-V element and nitrogen, and a cap layer, as described herein.

In some embodiments, the superlattice structure is characterized by a concerted emission and/or transmission of radiation (laser light emission and/or transmission) in a wavelength that ranges from 1.3 µm to 1.6 µm.

In some embodiments, the thickness of one period of the superlattice, which includes a well-layer and a cap-layer, ranges from 10 Å to 20 Å.

According to an aspect of some embodiments of the present invention, there is provided an optical device which includes one or more of the superlattice structure presented herein.

In some embodiments, the superlattice structure is configured as a laser light source characterized by a wavelength that ranges from 1.3 µm to 1.6 µm.

In some embodiments, the superlattice structure as described herein is forming a part of a data communication system.

According to an aspect of some embodiments of the present invention, there is provided an optical communications system which includes at least one of the superlattice structures presented herein.

In some embodiments, the optical communication system is configured to use a laser light source characterized by a wavelength that ranges from 1.3 µm to 1.6 µm.

According to an aspect of some embodiments of the present invention there is provided a light detection, emission and/or transmission device which includes at least one of the superlattice structures presented herein, selected from the group consisting of an imaging system, a quantum teleportation system, a quantum cryptography system, a quantum computer and a target-analyzing system.

In some embodiments, the imaging system includes a superlattice structure as described herein.

In some embodiments, the optical communications system includes a superlattice structure as described herein.

In some embodiments, the quantum teleportation system includes a superlattice structure as described herein.

In some embodiments, the quantum cryptography system includes a superlattice structure as described herein.

In some embodiments, the quantum computer includes a superlattice structure as described herein.

In some embodiments, the system for analyzing a target material includes a superlattice structure as described herein.

As used herein the term "about" refers to ±10%.

The terms "comprises", "comprising", "includes", "including", "having" and their conjugates mean "including but not limited to". The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, physical and material arts.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods and examples are illustrative only and are not intended to be necessarily limiting.

BRIEF DESCRIPTION OF THE DRAWINGS

Some embodiments of the invention are herein described, by way of example only, with reference to the accompanying drawings and images. With specific reference now to the drawings and images in detail, it is stressed that the particulars shown are by way of example and for purposes of illustrative discussion of embodiments of the invention. In this regard, the description taken with the drawings and images makes apparent to those skilled in the art how embodiments of the invention may be practiced.

In the drawings:

FIGS. 5A-B present the indium monolayer growth rate as a result of the TMIn exposure times, wherein FIG. 5A presents the photoluminescence spectra obtained from three exemplary two-monolayer InAs/GaAs quantum wells grown by an ALE process according to some embodiments of the present invention, and FIG. 5B presents the growth rate of the indium monolayer as a function of the TMIn exposure time;

DESCRIPTION OF EMBODIMENTS OF THE INVENTION

Figure 1:
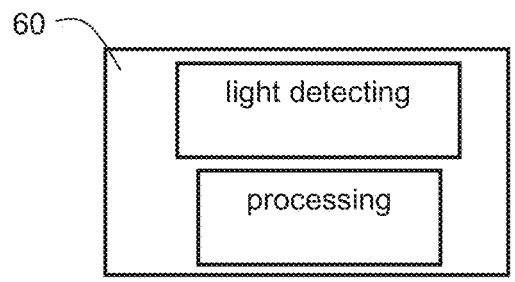
FIG. 1 is a schematic illustration of an imaging system, according to some embodiments of the present invention.

The present invention, in some embodiments thereof, relates to semiconductors, and more particularly, but not exclusively, to high-indium content quantum wells having controllable nitrogen content, processes of preparing same by atomic layer epitaxy, superlattices containing same and uses thereof.

Before explaining at least one embodiment of the invention in detail, it is to be understood that the invention is not necessarily limited in its application to the details set forth in the following description or exemplified by the Examples. The invention is capable of other embodiments or of being practiced or carried out in various ways.

As discussed hereinabove, a quantum well can be allegorize as a sandwich of a well-layer between two barrier-layers, each composed of a semiconducting substance and characterized by specific chemical and electronic traits. When a reference direction of growth is used, the barrier-layer on which the well-layer is grown is referred to as the base-layer, and the other barrier-layer gown on the well later is referred to as the cap-layer. The electronic/optic properties of the quantum well depend in part on the thickness of the well-layer.

A semiconducting superlattice structure is afforded by combining one semiconductor of a given thickness and a given electron affinity, alternately, (periodically) with another semiconductor of a different thickness and a different electron affinity, thus constituting a periodic arrangement of quantum wells. This superlattice is characterized by a conduction band having a base which varies periodically. When an electron having a given energy is injected into this superlattice, the electron is reflected quantum-mechanically at potential discontinuities, i.e., an interface between the two semiconducting substances. Accordingly, if the physical parameters of the semiconductors are pertinently designed so that phase differences of reflected waves of injected electrons can be controlled, effective energy potential barriers against injected electrons become virtually controllable. A superlattice structure may also be characterized by a repetitive sequence of layers, referred to as a period, wherein each period is a quantum well layer and a cap-layer, and the latter serves as the base-layer for the next quantum well layer. This "barrier/well" double-layer repetitive period is known as a short-period, and the entire structure known as a short-period superlattice structure (SPSL). Other types of quantum wells, known as B-type quantum wells, would form a superlattice structure having a "barrier/well-I/well-II" triple-layer period, and so on.

As discussed hereinabove, the driving force behind the vast research of semiconducting quantum well structures comprising dilute nitride alloys in recent years stems from the finding that low concentrations of nitrogen (1-2%) in the alloy has a notable and controllable effect of the conducting bands of semiconductors such as GaAs and InGaAs; particularly on the width of the "forbidden" band gap which is lowered by about 100 meV per 1% of nitrogen. This effect allows the realization of improved devices for optical and other applications based on GaAs as a base-layer. The main impediment for implementing dilute nitride alloys at commercial scales is the difficulties in growing high quality GaInAsN or GaInAsSbN active quantum well on GaAs substrate, which can emit 1.3-1.6 micron laser light, which will compete with the GaInAs(P)/InP state of the art technology.

Currently used methods for preparing high-indium content and about 2% nitrogen content quantum wells rely on lowering the temperature of the substrate, however, while low temperatures assist in increasing the nitrogen content, the crystallinity and optical characteristics of the layers decreases and so is the quality of the resulting structure. This limitation is even greater when the deposition is effected by organometallic sources (MOCVD).

Since superlattice structures based on gallium arsenide and indium arsenide are characterized by high degree of strain, leading to reduced crystallinity and lower quality of the resulting quantum wells and superlattice structures, the present inventors recognized a need for a process which can afford large and well ordered high-indium content quantum wells and superlattice structures which would exhibit an improved performance as compared to currently produced superlattices.

The present inventors have realized that the benefits of the ALE monolayer growth process can be harnessed to overcome the main impediments of nitrogen incorporation during growth of large and well-ordered superlattice structures, particularly those of high-indium content.

While reducing the present invention to practice, the present inventors have demonstrated the production of high-indium content InAsN quantum wells, while using the ALE process. Moreover, the present inventors have surprisingly uncovered that lowering the working temperatures during the ALE process presented herein while exposing the growing layers to nitrogen, does not reduce the crystal quality of the resulting structure, and that sharp interfaces and uniform conformal layers are obtained with high level of controllability over the thickness of the periodic layers of the superlattice structure and the amount of nitrogen incorporated therein.

Hence, according to an aspect of some embodiments of the invention, there is provided a process of forming a quantum well structure which includes a base-layer and a well-layer, wherein the well-layer, as defined hereinbelow, includes a group-III element, a group-V element and nitrogen.

It is to be noted that while a well-layer is described herein as containing nitrogen as one of the element composing it, the final layer comprises a nitride composition of the elements. Accordingly, for simplicity purposes, herein throughout, a nitride-type well-layer is described as a well layer that comprises nitrogen.

The process, which is typically performed in a sealed reaction chamber, is effected by:

(a) epitaxially growing the base-layer on a substrate or a platform;

(b) epitaxially growing the well-layer on the base-layer; and (c) growing the cap-layer on the well-layer;

thereby forming the quantum well structure.

According to embodiments of the invention, epitaxially growing the well-layer is effected by atomic layer epitaxy (ALE), namely:

(i) exposing the base-layer to a precursor of a group-III element, to thereby form, on the base-layer, a first atomic layer composed of atoms of a group-III element deposited thereon;

(ii) terminating the exposure to the group-III element precursor;

(iii) exposing the base-layer having the first atomic layer to a precursor of nitrogen, to thereby form the base-layer having the first atomic layer deposited thereon and atoms of nitrogen absorbed onto the first atomic later;

(iv) terminating the exposure to the nitrogen precursor;

(v) exposing the base-layer to a precursor of a group-III element, to thereby form on the base-layer a second atomic layer of atoms of a group-III element;

(vi) terminating the exposure to the group-III element precursor; and (vii) exposing the base-layer having the first atomic layer, nitrogen and the second atomic layer deposited thereon, to a precursor of the group-V element.

As used herein, the term "well-layer" refers to the inner layer in a quantum well structure, as opposed to the two flanking barrier-layers, as these terms are known in the art.

By "epitaxially growing" with respect to the base-layer or the cap-layer it is meant that the base-layer and the cap-layer (any barrier layer according to some embodiments of the present invention) can be formed by any conventional epitaxy method, such as, for example, solid phase epitaxy (SPE), vapor phase epitaxy (VPE), hot-wall epitaxy (HWE), chemical vapor deposition (CVD), molecular beam epitaxy (MBE) or metal organic chemical vapor deposition (MOCVD), wherein all the layer elements are introduced essentially at once, as opposed to the manner by which layer elements are introduction using atomic layer epitaxy (ALE).

As known in the art and according to some embodiments of the present invention, the base- and cap-layers can be formed of various chemical compositions. The chemical composition of the base layer and the cap layer can be the same or different.

Suitable substances for forming the base layer and/or the cap layer include, but are not limited to, GaAs, GaAsSb, GaAsSbN, AlGaAs, GaAsP, GaSb, GaSbN and GaInAs, including combinations thereof, nitrides, oxides and the likes.

In some embodiments, a base layer comprises GaAs. In some embodiments, base layer which comprises GaAs is formed by conventional MOCVD.

In some embodiments, a cap layer comprises GaAs. In some embodiments, a cap layer which comprises GaAs is formed by conventional MOCVD.

In some embodiments, a cap layer comprises GaAsSb. In some embodiments, a cap layer which comprises GaAsSbN is formed by conventional growth techniques.

Regardless of the method by which the barrier-layers (the base layer and the cap layer) are formed, and the substance(s) constituting same, the nitride-containing well-layer, according to some embodiments of the present invention, is formed by atomic layer epitaxy, wherein each precursor of each of the elements is introduced into the reaction chamber individually, while no other precursor is introduced concomitantly. Accordingly, in the process described herein, a precursor of one substance is introduced to the reaction chamber after terminating the exposure to the previous substance (e.g., by cutting-off the supply of the previous precursor to the reaction chamber).

The optical and electronic properties of the quantum wells, prepared by the process presented herein, are influenced by the selection of certain elements to form the various layers.

As discussed herein, the well-layer in the quantum well structure described herein comprises a group-III element, a group-V element and nitrogen.

Exemplary useful group-III elements include, but are not limited to, gallium, indium, thallium and aluminum.

Exemplary useful group-V elements include, but are not limited to, arsenic, antimony and phosphorous.

As discussed hereinabove, a chemical substance, referred to herein as a precursor, is used as a source of each element.

Exemplary precursors of nitrogen include, but are not limited to, dimethylhydrazine (DMH), ammonia, hydrazine, monomethylhydrazine, t-butylhydrazine, phenylhydrazine, t-butylamine and nitrogen trifluoride.

Exemplary precursors of gallium include, but are not limited to, trimethylgallium ($Ga(CH_3)_3$), diethyl gallium chloride ($Et_2GaCl$) and the likes as known in the art.

An exemplary precursor of indium includes, but is not limited to, trimethylindium ($In(CH_3)_3$).

Exemplary precursors of arsenic include, but are not limited to, arsine ($AsH_3$), t-butylarsine ($t$-Bu)$AsH_2$ and tri-t-butylarsine.

Other group-V element precursors include $PH_3$, (t-Bu)$PH_2$, $(CH_3)_3Sb$, $(CH_3)_3Bi$ and the likes.

It would be appreciated that a person skilled in the art would readily select suitable other precursors for the Group-III element, group-V element and nitrogen, as described herein. Such other precursors are contemplated herein.

The well-layer that contains group-III/V elements and nitrogen is formed by exposing the base-layer at least twice to the group-III element, introducing nitrogen between group-III element exposures, and at least once to the group-V element. The group-III element can be the same in each exposure, or different.

Other combinations of group-III/V elements are possible when forming the well-layer according to some embodiments of the present invention, such that would afford various combinations of elements. Non-limiting examples of group-III/V elements combinations include binary III/V indium-containing semiconductor alloys such as InAs, InSb, InP and InBi, and ternary III/V indium-containing semiconductors alloys such as InAsGa, InAsSb, InAsBi, InSbBi, InAsP and InSbP.

According to some embodiments of the present invention, a dilute nitride can be formed with any of the aforementioned group-III/V elements combinations and others, all being contemplated herein.

At the final stage of the epitaxial reaction, the well-layer is characterized by a unique chemical composition based on the presence of the group-III element, the group-V element and nitrogen, and particularly based on the relative ratio therebetween.

According to some embodiments of the present invention, the number of atoms of the group-III element in the well-layer prepared by the process presented herein is at least 50 percents of the total number of atoms of the well-layer. Such a high ratio of group-III element atoms, which is necessary for most quantum well applications, is also one of the reasons behind the difficulties in incorporating nitrogen atoms into the well-layer; however, these difficulties are obviated by the process presented herein.

In some embodiments, the number of atoms of the group-III element in the well-layer is 50 percents, 55 percents, 60 percents, 65 percents, 70 percents, 75 percents or even 80 percents, of the total number of atoms of the well-layer. Any number between these values is also contemplated.

According to some embodiments of the present invention, the number of nitrogen atoms ranges from 0.1 to 5 percent of the total number of atoms of the well-layer. Such a relative high number of nitrogen atoms enables to produce the dilute nitride effect discussed hereinabove in the quantum well resulting from the process presented herein.

In some embodiments, the number of nitrogen atoms ranges is 0.1 percent. 0.2 percent, 0.5 percent, 1 percent, 1.2 percent, 1.5 percent, 1.7 percent, 2 percents, 2.5 percents or 3 percents, of the total number of atoms of the well-layer. Any number between these values is also contemplated.

A perfect lattice can be defined fully by the lattice constants, namely the constant distance between the repetitive units in the lattice. A lattice having defects, mixed entities, dopants, and other distorting forces, is said to be imperfect. In epitaxial growth, the lattice constant is a measure of the structural compatibility between different materials. Lattice constant ratios govern the growth of thin layers of substances on other substances; when the constants differ, strains are introduced into the layer, which hinder epitaxial growth of thicker layers without defects. Matching of lattice structures between two different semiconductor substances, allows a region of band gap change to be formed in a material without introducing a change in crystal structure. This phenomenon is expressed in quantum wells and allows construction of advanced light-emitting diodes and diode lasers. For example, gallium arsenide, aluminium gallium arsenide, and aluminium arsenide have almost equal lattice constants, making it possible to grow almost arbitrarily thick layers of one on the other one. However, alloys having high indium content will exhibit strain when grown on gallium arsenide layers, and thick layer growth would be hindered. Still there is a critical thickness for each In content that affords a growth of strained layer with minimal lattice defects. The growth of strained layer below the critical thickness is rather common.

Strain between a layer epitaxially grown on a base layer can be quantified as a unit-less value by the ratio of the lattice constant of the base layer "a", namely the ratio between the difference in the lattice constants (the one of the base layer and the epitaxially grown layer, "$\Delta a$") and "a", or $\Delta a/a$ which is typically expressed in percents. For example, the substrate lattice constant of gallium arsenide, $a_{GaAs}$, is 2.45 Å, the lattice constant of indium arsenide, $a_{InAs}$, is 2.61 Å, and thus $\Delta a/a$ $(a_{InAs}-a_{GaAs})/a_{GaAs}$ is 6.9%.

As can be seen in the Examples section that follows, the successful incorporation of such a relative high content of nitrogen atoms in a well-layer having such a high concentration of group-III element atoms (e.g., Indium), is a result of a high level of strain in the atomic layer of the group-III element. Without being bound by any particular theory, it is assumed that nitrogen atoms will remain a part of the chemical composition of the well-layer only if it is strained enough, that is, strained to some optimal level. An accepted theory in the art postulates that the nitrogen incorporation reduces the strain is the driving force to the remaining nitrogen content in the layer.

Hence, according to some embodiments of the present invention, the strain in the first atomic layer formed in the process presented herein is greater than 2 percents, and according to other embodiments, the strain is greater than 5%, 6%, 7% or 10%.

The necessary strain in the first atomic layer formed in the process presented herein, can be realized by allowing an excess of group-III element atoms to deposit on the base-layer and reach a certain thickness. As shown in the Examples section that follows, the optimal thickness can be reached by varying the time period during which the substrate is exposed to the precursor of the group-III element. Hence, according to some embodiments of the present invention, the exposure of the base-layer to the precursor of the group-III element is performed for a time period that ranges from 5 second to 50 seconds.

A too-short exposure will result in a thin and therefore less strained, and partially covered atomic layer, and overexposure will result in a highly strained and disordered layer which has overshot the optimal thickness. A method for optimizing the exposure time is presented in the Examples section that follows. According to some embodiments of the present invention, the time period for exposure to the precursor of the group-III element ranges from 6 second to 10 seconds, and alternatively, the exposure time period is 7 seconds.

The exposure to the nitrogen source is not characterized by a peak-function optimum, and can therefore extend over the time it takes for a full layer of nitrogen atoms to form over the first atomic layer. Without being bound by any particular theory, it is assumed that the nitrogen layer formation is self-terminating.

According to some embodiments of the present invention, the exposure of the base-layer having the first atomic layer, to the nitrogen precursor is performed for a time period that ranges from 5 second to 50 seconds. According to some embodiments of the present invention, this exposure time is 20 seconds.

The second exposure of the substrate to the precursor to the group-III element precursor is also not characterized by a peak-function optimum, and without being bound by any particular theory, it is assumed that the growth of the second atomic layer of group-III element atoms is also self-terminating.

According to some embodiments of the present invention, the exposure of the base-layer having the first atomic layer deposited thereon and the nitrogen absorbed thereto, to the group-III element precursor is performed for a time period that ranges from 5 second to 50 seconds. According to some embodiments of the present invention, this exposure time is 30 seconds.

Another factor that governs the incorporation of nitrogen atoms and inhibit the tendency of nitrogen to escape from the well-layer, is the low temperature at which the well-layer is being formed, relative to the temperature at which the base-layer can be formed. There is therefore a link between the reaction temperature and the content of nitrogen in the final layer.

In general, the base-layer of the quantum wells according to some embodiments of the present invention, can be formed at temperatures similar to that used in any conventional process, since no nitrogen-containing layer is present, however, any other barrier layer which would follow a nitrogen-containing layer prepared according to some embodiments of the present invention, would be formed at a lower temperature so as to promote maintaining as much nitrogen in the well layer as required.

Hence, according to some embodiments of the present invention, the epitaxial growth of the well-layer onto the base-layer is performed at a temperature lower than 650° C., which is typically used in many epitaxy methods including ALE. In some embodiments, the epitaxial growth of the well-layer onto the base-layer is performed at a temperature lower than 600° C. In some embodiments, it is performed at a temperature lower than 550° C. In some embodiments, it is performed at a temperature not higher than 520° C.

In order to keep the nitrogen atoms incorporated in the well-layer, it is desirable that the formation of the cap-layer is also performed at a low temperature, relative to the temperature at which the base-layer can be formed if nitrogen is not present. Hence, according to some embodiments of the present invention, the epitaxial growth of the cap-layer onto the base-layer is performed at a temperature lower than 650° C., which is typically used in many epitaxy methods including ALE. In some embodiments, the epitaxial growth of the well-layer onto the base-layer is performed at a temperature lower than 600° C. In some embodiments, it is performed at a temperature lower than 550° C. In some embodiments, it is performed at a temperature not higher than 520° C.

The thickness of the well-layer depends on the chemical composition thereof as well as on the multiplicity of the monolayers therein, namely the number of monolayers it comprises. A single monolayer is typically not sufficient to produce a useful quantum well, and a well-layer too thick will suffer from distortions of the lattice due to strain and lattice defects. Therefore, it is desirable to produce a well-layer which is a multi-monolayer such as a two-monolayer (as thick as a lattice of two monolayers), a three-monolayer, and in some cases a four-monolayer.

Hence, according to some embodiments of the present invention, the well-layer is a multi-monolayer, e.g., a two-monolayer, a three-monolayer or a four-monolayer. According to some embodiments of the present invention, the well-layer is a two-monolayer layer.

The formation of a multi-monolayer can be controlled by, for example, manipulating the time of exposure to each precursor of an element (layering) comprising the multi-monolayer, or repeating the layering of any of the elements after layering another element.

The formation of a cap-layer over the well-layer completes the formation of the basic quantum well structure. When seeking certain performance from quantum well structures, particularly laser energy output, one has to construct a superlattice structure comprising several quantum well structures layered one on top of the other. According to some embodiments of the present invention, the process of forming one quantum well, which can be regarded as the first period of a superlattice structure, can be extended so as to form an additional well-layer on-top of the cap-layer of the first quantum well (first period), thereby forming a second period in the superlattice structure.

Hence, according to some embodiments of the present invention, the process further includes, subsequent to the epitaxial growth of the first cap-layer, epitaxially growing on the cap-layer an additional well-layer, similar to the firstly grown well-layer, which also includes a group-III element, a group-V element and nitrogen. According to some embodiments of the present invention, the additional well-layer can be different in composition and/or thickness from the firstly grown well-layer.

To complete the period of the superlattice structure, an additional cap-layer is epitaxially grown on-top of the second well-layer. As discussed hereinabove, the cap-layer of the first period serves as a buffer-layer between the two quantum well structures, and serves as the base-layer for the second quantum well.

According to some embodiments of the present invention, a superlattice structure consisting of a repetitive formation of quantum well structures grown according to process presented herein may have from 2 to 6 periods (stacked quantum well structures).

According to some embodiments of the present invention, the process for to preparing a quantum well as presented herein, may further include, subsequent to epitaxially growing the cap-layer, epitaxially growing onto this cap-layer, sequentially, a plurality of additional well-layers, each independently comprising a group-III element, a group-V element and nitrogen, and a plurality of additional cap layers. Such a process essentially produces a superlattice structure of a repetitive short-period, or a SPSL.

According to another aspect of the present invention, there is provided a quantum well structure prepared by the process presented herein.

According to another aspect of the present invention, there is provided a superlattice prepared by the process presented herein.

The process presented herein can afford nitrogen-containing quantum wells which are reproducible and viable, or of superior qualities as compared to equivalent quantum wells not having nitrogen incorporated therein, or compared to equivalent nitrogen-containing quantum wells prepared by other methods and processes.

Hence, according to another aspect of the present invention, there is provided a quantum well having a base-layer and a well-layer, which comprises a group-III element, a group-V element and nitrogen, and a cap layer.

These quantum wells can have any configuration and design, such as type-I, type II and type-III single quantum well, as well as forming a part of a multiple-quantum well, type-I superlattice and type-II superlattice structures, as these terms are recognized in the art.

The quality of the quantum wells according to some embodiments of the present invention, is estimated by comparison to known standards obtained from various comparable samples. The characterization is typically done by the following photoluminescence (PL) line width, PL intensity dependence to low and high temperature (low quenching at high temperature is the preferred), width of high resolution X-ray diffraction (HRXRD) reflections, high resolution transmission electron microscopy and other methods.

In some embodiments, any of the quantum-well structures described herein comprises a high content of a group-III element, as described herein.

In some embodiments, a quantum-well structure as described herein comprises indium at a concentration is which the number of indium atoms at least 50 percents of the total number atoms of the well-layer.

In some embodiments, any of the quantum-well structures described herein comprises nitrogen content as described herein.

A typical signature of good quality quantum well is a narrow peak (PL and HRXRD), high PL intensity and small dependence of PL intensity on temperature which reflects the amount of defects and carrier confinement, especially the holes confinement in the quantum well. As can be seen in the Examples section that follows, the hole confinement in the superlattice structure made from InAsN quantum wells according to some embodiments of the present invention, is better than in the best known GaInAsN quantum wells (150 meV valance band off-set in comparison to about 90 meV valence band off set of published in literature $Ga_{0.57}In_{0.43}As_{0.993}N_{0.007}$ [Appl. Phys. Lett., 82, pp. 1500-2, 2003]. The benchmark performance is that of a GaInAs quantum well since the incorporation of N (even 1-2 percent) affects strongly the crystal quality.

The most widely used method for estimating quantum well quality is the width of the PL spectrum peak. Hence, according to some embodiments of the present invention, the peak of a photoluminescent (PL) spectrum obtained from a quantum well as presented herein, is wider than a peak of a photoluminescent (PL) spectrum obtained from an equivalent quantum well which does not contain nitrogen.

In some embodiments, the peak of a photoluminescent (PL) spectrum obtained from a quantum well as presented herein, is wider than a peak of a photoluminescent (PL) spectrum obtained from an equivalent quantum well which does not contain nitrogen by at least 5 percents.

In some embodiments, the peak of a photoluminescent (PL) spectrum obtained from a quantum well as presented herein, is wider than a peak of a photoluminescent (PL) spectrum obtained from an equivalent quantum well which does not contain nitrogen by less than 100% (no more than twice the width). In some embodiments, it is wider by 70%, 50%, 30%, 20% or by 10%.

As discussed hereinabove, a superlattice structure consisting of a stack of quantum well structures prepared by the process presented herein, can be characterized by several physical properties, mostly related to the optical performance of a laser optical device based on that superlattice structure.

Accordingly, there is provided a superlattice structure which includes at least one of the quantum-well structures prepared by the process presented herein.

According to another aspect, there is provided a superlattice structure, which consists of one or more periods, each independently having at least one well-layer which includes a group-III element, a group-V element and nitrogen, and a cap layer, as described herein.

According to some embodiments of the present invention, the thickness of one period in the superlattice structure presented herein, which includes a well-layer and a cap-layer, ranges from 10 Å to 20 Å.

According to some embodiments of the present invention, any of the superlattice structures can consist of 2 to 6 periods (repetitions) of the basic quantum well structure.

The characterization of the superlattice structure is typically done by characterizing a laser light emitting device based thereon. The quality of a laser light emitting device, either an edge emitter or vertical cavity surface emitting laser, reflects the quality of the material and the structure design. The main parameters used as figures of merits to characterize lasers are the threshold current (which strongly dependent on emission wavelength) and the temperature sensitivity expressed by the parameter known as $T_0$. As a benchmark, the best dilute-nitride lasers known today (GaInAsN by MOCVD or GaInAsSbN by MBE) are characterized by threshold currents of about 200 A/cm$^2$ at 1.3 micron and 330 A/cm$^2$ at 1.5 micron, with $T_0$ of about 70-100° K for both wavelength regions.

As discussed hereinabove, one of the main goals of present-days research is a high-quality and commercially viable optical device that can emit laser at ranges from 1.3 μm to 1.6 µm. The driving force for long-wavelength (1.3-1.6 micron) laser devices is the incredible growth of the internet and data transmission that pushing the bandwidth requirements for metro, local and storage area networks to unprecedented performance levels. The primary focus is the development of low cost, 1.3-1.6 µm, directly modulated, un-cooled vertical-cavity surface-emitting laser (VCSEL) devices, since an optics-based communication network would require a myriad VCSELs, with laser low cost and ultimately integration are the major issues.

Hence, according to some embodiments of the present invention, the superlattice structures presented herein are characterized by a concerted emission of radiation (laser light) in a wavelength that ranges from 1.3 µm to 1.6 µm.

The superlattice structures presented herein can serve as a candidate of choice for lasers in an optics-based communication network. In addition to the primary focus on low-cost VCSELs, there are additional devices that can benefit from the superlattice structures presented herein, such as Raman and semiconductors optical amplifiers, detectors, sensors, modulators, switches, routers and the likes, all being contemplated herein.

A quantum well structure as described herein may form a part of a superlattice structure, as described herein, which in turn may form a part of an optical device such that can emit laser light at a predetermined energy level.

Hence, according to yet another aspect of the present invention, there is provided an optical device which includes at least one of the superlattice structures presented herein, namely superlattice structures consisting of quantum well structures as presented herein (e.g., quantum-well structures prepared by the process as described herein).

According to some embodiments of the present invention, the optical device is configured as a laser light source characterized by a wavelength that ranges from 1.3 nm to 1.6 µm.

According to some embodiments of the present invention, such a laser light emitting optical device may form a part of a data communication system.

Hence, according to another aspect of the invention, there is provided an optical communications system which includes at least one of the superlattice structures presented herein.

The superlattice structures presented herein can be developed and used as emitter and as detectors of photons in a wide range of wavelengths and flux, and can therefore be useful in the construction and design of many applications including, but not limited to imaging systems, quantum teleportation systems, quantum cryptography systems, quantum computers and many others.

Reference is made to FIG. 1 which is a schematic illustration of an imaging system 60, according to some embodiments of the present invention. System 60 comprises a light detecting unit 62 which generates electrical current in response to light and a processing unit 64 which generates an image based on the generated current. Light detecting unit 62 can comprise one or more superlattice structures, such as the superlattice described herein provided that the superlattice structure is configured for detecting light. For example, several such superlattice structures can be arranged pixelwise.

Figure 2:
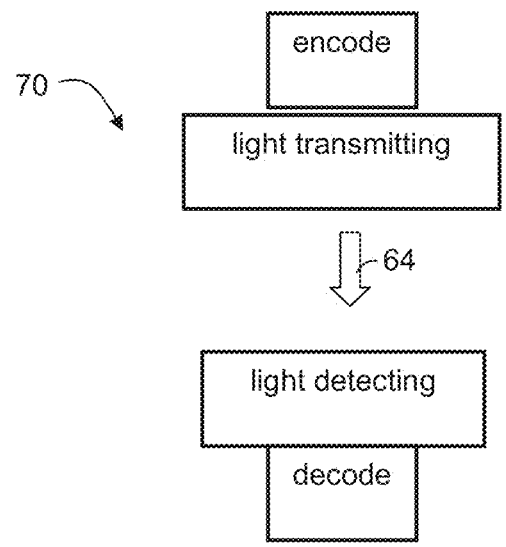
FIG. 2 is a schematic illustration of an optical communications system, according to some embodiments of the present invention.

FIG. 2 is a schematic illustration of an optical communications system 70, according to some embodiments of the present invention. Communications system 70 comprises a light emission and/or transmission unit 72 for emitting and/or transmitting light 74 and light detecting unit 76 which generates electrical current in response to light 74. Light detecting unit 62 can comprise one or more superlattice structure such as the superlattice structure described herein provided that the superlattice structure is configured for detecting light. Alternatively, light detecting unit 62 can comprise one or more of the light detecting systems described in a U.S. patent application Ser. No. 12/789,479 entitled "Method and System for Detecting Light" to Vardi et al. which is co-filed with the present application and is owned in common with the present application. Other types of light detecting units are not excluded from the scope of the present invention. Light emitting and/or transmitting unit 72 can comprise one or more of the superlattice structure of the present embodiments. Other types of light emitting and/or transmitting units are not excluded from the scope of the present invention.

System 70 preferably also comprises an encoder 76 coupled to unit 72 and configured for encoding information into light 74 prior to the emission and/or transmission, and a decoder 78 which receives electrical current from unit 74, decodes it and outputs the information to an external appliance (not shown). Optionally, system 70 operates in the infrared domain. System 70 can be used in more than one way. In some embodiments of the present invention system 70 is employed as a quantum teleportation system wherein quantum information ("qubits") is transferred from unit 72 to unit 74. In some embodiments of the present invention system 70 is employed for quantum cryptography wherein encoder 76 and decoder 78 are configured to encrypt and decrypt the information encoded into light 74.

In an aspect of some embodiments of the present invention the superlattice structure is used as a component in a quantum computer. Quantum computing generally involves initializing the states of several entangled qubits, allowing these states to evolve, and reading out the states of the qubits after the evolution.

Figure 3:
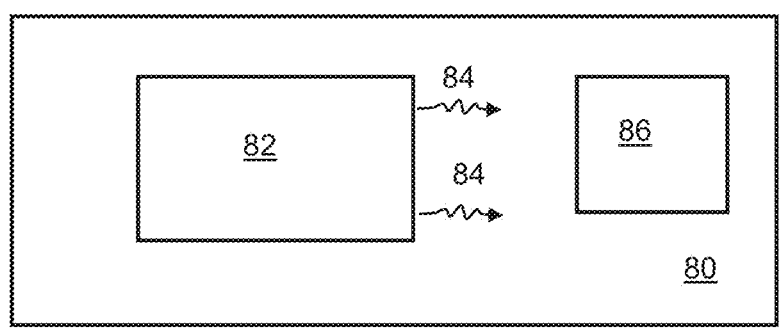
FIG. 3 is a schematic illustration of a quantum computer system according to some exemplary embodiments of the present invention.

FIG. 3 is a schematic illustration of a quantum computer system 80 according to some exemplary embodiments of the present invention. System 80 comprises an emission device 82 which emits two, preferably, entangled photons 84a and 84b. Emission device 82 can comprise one or more of the superlattice structure of the present embodiments. System 80 further comprises a calculation unit 86 which detects the photons, uses them as entangled qubits and performs calculations as known in the art. Calculation unit 86 can comprise one or more superlattice structure such as the superlattice structure described herein, provided that the superlattice structure is configured for detecting light. Alternatively, unit 86 can comprise one or more of the light detecting systems described in a U.S. patent application Ser. No. 12/789,479 entitled "Method and System for Detecting Light" to Vardi et al. which is co-filed with the present application and is owned in common with the present application.

In an aspect of some embodiments of the present invention system 10 is used for microscopy and or spectroscopy. In these embodiments photons are emitted in the direction of a sample to induce an optical effect in the sample.

Figure 4:
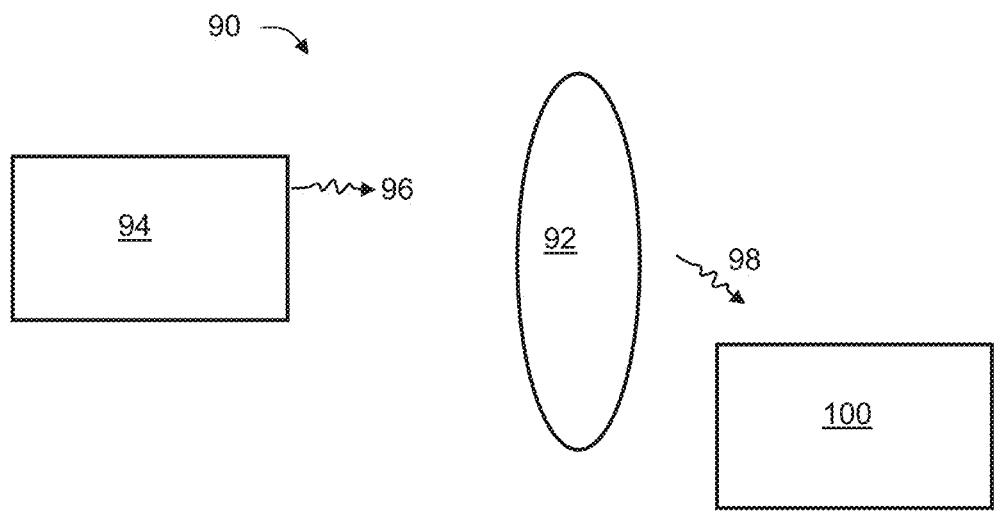
FIG. 4 is a schematic illustration of a system for analyzing a target material, according to some embodiments of the present invention.

FIG. 4 is a schematic illustration of a system 90 for analyzing a target material 92, according to some embodiments of the present invention. System 90 can be used for spectroscopy, microscopy and/or imaging of target material 92. For example, when target material 92 contains a fluorophore therein, system 90 can be used for fluorescence spectroscopy. System 90 comprises a light emitting unit 94 which emits one or more photons 96 in the direction of material 92. Light emitting unit 94 can comprise one or more superlattice structure such as the superlattice structure described herein. Other types of light emitting units are not excluded from the scope of the present invention.

The emitted photons can be absorbed, transmitted or reflected by the material. When the photons can be absorbed, the material can emit in response radiation 98 which can be detected by a light detecting unit 100. When the photons are transmitted or reflected unit 100 detects the transmitted or reflected radiation. Unit 100 generates an electrical current responsively to radiation 98, which current is can be analyzed to determine, for example, the composition of the target material. Unit 100 can comprise one or more of the superlattice structures according to some embodiments of the present invention, provided that the superlattice structure is configured for detecting light. Alternatively, unit 86 can comprise one or more of the light detecting systems described in a U.S. patent application Ser. No. 12/789,479 entitled "Method and System for Detecting Light" to Vardi et al. which is co-filed with the present application and is owned in common with the present application.

It is expected that during the life of a patent maturing from this application many relevant ALE-based processes for preparing dilute-nitride quantum wells will be developed and the scope of the phrase "ALE-based dilute-nitride quantum wells" is intended to include all such new technologies a priori.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions, illustrate some embodiments of the invention in a non limiting fashion.

Example 1

Materials and Methods

InAsN layers were grown on semi-insulating (001)-oriented GaAs substrates using a low-pressure metal organic chemical vapor deposition (MOCVD) upside-down vertical reactor. The grown samples consisted of 1000 Å GaAs buffer layers grown at 650° C., followed by the ALE growth of (Ga)InAs(N) quantum wells at 500° C. capped with a 12 Å layer of GaAs grown conventionally at the same temperature. On top of the nitride layer, 500 Å GaAs spacers were grown at a temperature of 650° C. The low growth temperature of the cap was effected to reduce escape of nitrogen, as discussed hereinbelow.

The elements which were used in the following examples are listed in the partial periodic table of the elements, presented as Table 1 below.

TABLE 1

|  | Group III | Group V |
|---|---|---|
| Period 2 |  | Nitrogen (N) |
| Period 3 |  |  |

TABLE 1-continued

|  | Group III | Group V |
|---|---|---|
| Period 4 | Gallium (Ga) | Arsenic (As) |
| Period 5 | Indium (In) | Antimony (Sb) |

Trimethylgallium (TMGa) and trimethylindium (TMIn) were used for the ALE growth as Group III sources; arsine ($AsH_3$) and dimethylhydrazine (also referred to herein and in the art as DMH, DMHy, unsymmetrical dimethylhydrazine, UDMH and 1,1-dimethylhydrazine) were used as Group V sources; and $H_2$ was used as the carrier gas.

Exemplary (Ga)InAsN/GaAs quantum wells were grown by atomic layer epitaxy (ALE) using alternating exposures to III and V column sources of In or Ga, N, or As. Non-nitride containing reference (Ga)InAs quantum wells were grown by similar ALE sequences using only an As-group V source. Each physical sample consisted of an area of the reference InAs quantum well and an area of an InAsN quantum well, both supported by a 500 Å GaAs buffer layer therebetween.

All samples were characterized using photoluminescence (PL) and superlattice structures and single quantum wells were analyzed by their time-of-flight secondary ion mass spectroscopy (TOF-SIMS). PL measurements were conducted at 77° K using an S1 photomultiplier tube or a cooled germanium detector. 10 mW HeNe laser was used as an excitation source. Measurements were carried out at several locations on the samples to verify their uniformity. PL analysis was achieved using a conventional single-band envelope model based on empirical data of band-gap, effective mass and energy lineup dependence on N and In composition. The TOF-SIMS results were recorded in the dual beam analysis mode. The nitrogen concentration was measured using the negative mode.

Example 2

Growth-Rates of Indium Monolayers

The time required to grow a single atomic layer (AL) of indium using a constant flow from a TMIn source ("Group III" column) was determined by changing the exposure time of the substrate to the indium source, compared to known time of exposure extracted from conventional growth rates. Three types of samples with quantum wells consisting of two InAs monolayers (ML) growth cycles were prepared with TMIn exposure times of 5, 7, and 10 seconds, followed by a 30 seconds exposure to arsine ($AsH_3$, "Group V" column) to assure full coverage.

Figure 5:
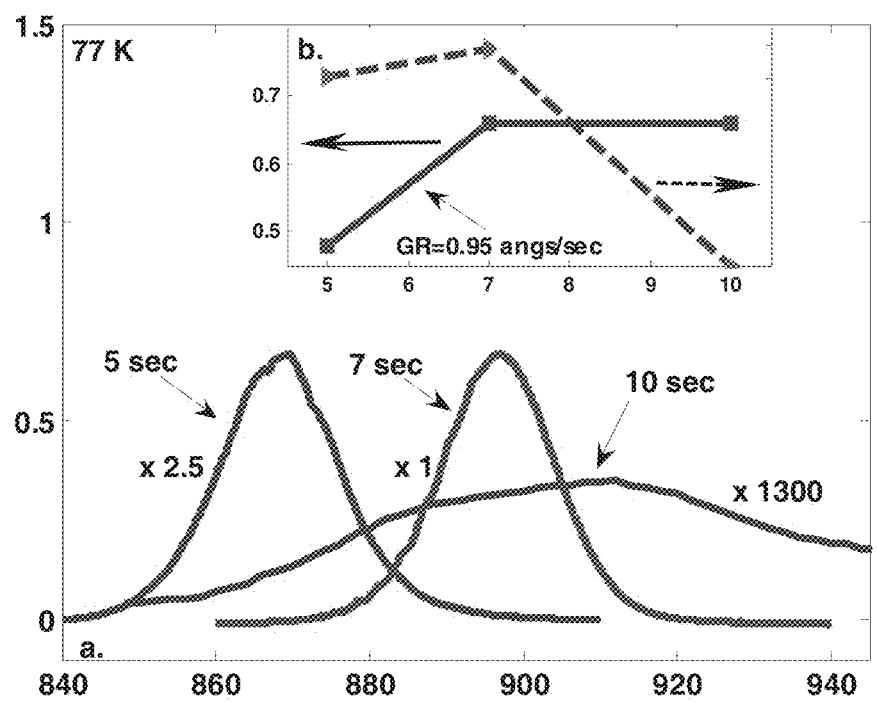

FIGS. 5A-B present the indium monolayer growth as a result of the TMIn exposure times, wherein FIG. 5A presents the PL spectra of the three ALE-grown InAs quantum wells, and FIG. 5B presents the growth rate of the indium arsenide layer as a function of the TMIn exposure time.

As can be seen in FIG. 5A, the thickness of the InAs layers was found by comparing the calculated energy of the fundamental optical transition with the measured PL emission wavelengths. As can be seen in FIG. 5B, the calculated growth rate from the samples grown at 5 and 7 seconds TMIn exposure time was 0.95 Å per second. As can be concluded from the results shown in FIGS. 5A-B, an exposure time of 7 seconds is required and sufficient to grow a full single atomic layer of indium. This value agrees with the value of 0.98 Å/s of the measured growth rate from GaInAs quantum wells grown conventionally using the same growth parameters.

The minimum PL line width for these quantum wells, namely 22 meV at 77° K, was measured for quantum wells grown with a TMIn exposure time of 7 seconds. The highest relative intensity (see, FIG. 5B) of this sample's PL, as well as the emitted wavelength of 897 nm, confirmed that a full indium atomic layer has grown under these conditions [Tischler, M. A. et al., *Appl. Phys. Lett.*, 49, 1199, 1986] and that a full two-monolayer InAs structure (6.6 Å) has formed.

The PL spectra obtained from the quantum well sample grown at a 5 seconds TMIn exposure time showed a lower wavelength of 870 nm, as well as a decrease in intensity by a factor of 2, and an increased line-width by a factor of 1.2. This result indicated that the grown indium atomic layer was not full, and that the two-monolayer quantum well structure having a thickness of 4.8 Å was similarly not complete. Increasing the TMIn exposure time to 10 seconds reduced the PL intensity by three orders of magnitude relative to the other two structures and increased the line-width by a factor of four.

Figure 6:
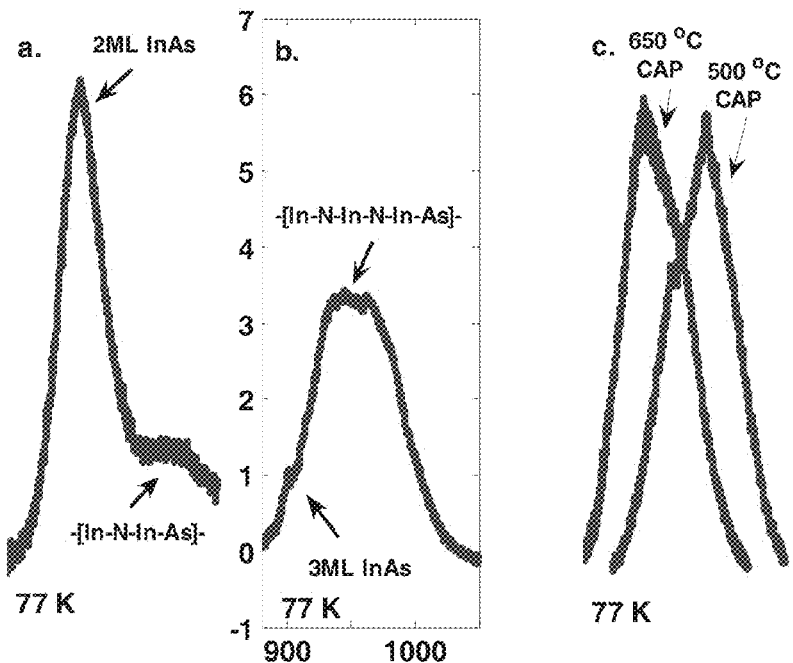
FIGS. 6A-C present the photoluminescence spectra at 77° K of exemplary two-monolayer InAs and InAsN quantum wells (FIG. 6A) and of exemplary InAs and InAsN quantum wells grown by an ALE process according to some embodiments of the present invention, the photoluminescence spectra at 77° K of exemplary three-monolayer InAs and InAsN quantum wells grown by an ALE process according to some embodiments of the present invention (FIG. 6B), and the photoluminescence spectra at 77° K of exemplary InAsN quantum wells (FIG. 6C), grown by an ALE process according to some embodiments of the present invention at a GaAs cap temperature of 500° C. (right-hand peak) and with a GaAs cap temperature of 650° C. (left-hand peak)

FIGS. 6A-B present a comparison of the PL spectra obtained from ALE-grown quantum wells having a two-monolayer InAs and InAsN structures (FIG. 6A) and a three-monolayer InAs and InAsN structures (FIG. 6B), exposed for 7 seconds to a TMIn source.

As can be seen is FIGS. 6A-B, a decrease in the PL intensity of a factor of six is observed in the three-monolayer InAsN quantum well as compared to the two-monolayer InAs quantum well. This observation may indicate a decline in the crystal quality inflicted by the excessive strain when the layer thickness approaches the critical thickness value. This assumption is supported by the observation that the addition of N to this layer, which reduces the strain, markedly increases the PL intensity of InAsN in comparison to InAs quantum wells (see, FIG. 6B). However, an incomparable decrease in the crystal quality, expressed by a decrease in the PL intensity which was emitted from the two-monolayer InAs quantum well with a TMIn exposure time of 10 seconds (see, FIG. 5A), was observed even though the total exposure time of the two layers to TMIn was similar (two-monolayer correlates to 10 seconds exposure and three-monolayer correlates to 7 seconds exposure).

These results indicate that there was an excess adsorption of indium in the samples which were prepared by a 10 seconds TMIn exposure time, which reduced the crystal quality. Therefore, despite the fact that there was no significant increase in the thickness of the quantum wells as observed experimentally (namely between the 7 and 10 seconds TMIn exposure time quantum wells shown in FIG. 5A), it is assumed that no self-termination had occurred for the ALE-growth of InAs, and that indium atoms, at least to some extent, had continued to be adsorbed onto the surface after the completion of the atomic layer. In addition, there was no significant reconstruction of the crystal when arsine was introduced into the reactor at a later stage.

The results presented hereinabove stand in contrast to the ALE growth of InAs quantum wells using triethylindium at 480° C., as reported previously [Tischler, M. A. et al., *Appl. Phys. Lett.*, 49, 1199, 1986]. The above results indicate that the exact full III- and V-column atomic layer sequence growth is needed to obtain both crystal quality and full incorporation of the Group III and V atoms into the crystal.

Example 3

Incorporation of Nitrogen into InAs Quantum Wells

The incorporation of nitrogen (N) into the InAs quantum wells was effected by exposing the grown indium atomic layers to a flow of high molar fraction of $DMH/H_2$ without $AsH_3$ for a period of 20 seconds. This high volume of DMH assured full coverage of the atomic layer with N atoms. The red shift of the PL peak between the emissions measured from a reference InAs quantum well without N and the InAsN quantum well, both prepared with the same indium atomic layer sequence, was used to assess the quantity of the N incorporation into the layers. In addition, the results were confirmed from TOF-SIMS measurements of structures containing a few InAsN layers, as described below.

FIG. 6A shows the PL spectrum of a sample consisting of a two-monolayer InAs quantum well grown using an ALE sequence of [In—As—In—As], and a two-monolayer InAsN quantum well grown using a sequence of [In—N—In—As], where DMH replaced the arsine during the growth of the first Group V column atomic layer of As. As can be seen in FIG. 6A, an energy red shift of about 50 meV, a two-fold increase in the line-width, and a three-fold decrease in the peak intensity were observed for the InAsN quantum well with respect to the reference InAs quantum well.

Based on the aforementioned model, the calculated energy levels in the [In—N—In—As] quantum well, composed of an InAsN monolayer of 3.3 Å and an InAs monolayer of 3.3 Å, show that this shift is the result of the incorporation of about 2.5% of N atoms into the InAsN monolayer (an average of 1.25% in the entire quantum well). The relatively small amount of N content is attributed to the exchange reaction of N with As atoms and not to the growth of an incomplete nitrogen atomic layer. The three-fold factor difference in the PL intensity peaks emitted by the quantum well containing N and the reference quantum well (see, FIG. 6A), is relatively small and indicates a high crystal quality.

It is noted that if only 2.5% of the N atomic layer was adsorbed during the exposure to DMH, then the next atomic layer of indium grown thereon should have had a surplus of indium atoms which would lead to a degradation of the crystal quality (a degradation in the PL intensity), as was observed in the sample prepared by a 10 seconds exposure to TMIn source (see, FIG. 5A). Furthermore, as can be seen in FIG. 6B, the addition of a second N atomic layer grown in a sequence of [In—N—In—N—In—As] (three-monolayer InAsN structure), caused a red-shift in the spectra by the same amount as the first atomic layer, resulting in a total red-shift of about 100 meV with respect to the reference three-monolayer InAs quantum well. These observations indicate that the second indium atomic layer, which was grown on the top of the first N atomic layer, was a complete atomic layer; therefore it is concluded that a full atomic layer of N was adsorbed during the V-column exposure stage of layer growth, and that the N atoms were replaced at a later stage by As atoms.

The exchange of one atom belonging to the V-column by another atom during growth is known in the art. For example, the replacement of Sb by As both on the surface and one atomic layer below surface upon exposure to an As source during the MBE growth of GaSb has been reported previously [Xie, Q., et al., *J. Appl. Phys.*, 86, 329, 1999]. It has been shown elsewhere that the driving force for ideal element distribution in a GaInAsN quaternary alloy is determined by minimizing the alloy free energy, which includes the local strain, cohesive bond energy, and the temperature [Albrecht, M. et al., *Phys. Rev. Lett.*, 99, 206103, 2007], where the local strain is produced by the difference in bond length between the corresponding III-V combinations. However, in the example presented herein, the atom exchange was not suppressed at temperatures as low as 270° C. Without being bound by any particular theory, it is assumed that the As atoms of the "as-being-grown" GaAs cap diffuse a distance of a few atomic layers and replace the N atoms belonging to a fully-adsorbed N atomic layer, and the latter are being desorbed later. The percentage of N atoms that remain in the layer depends on the local strain caused by the neighboring III (Ga)In atomic layer and on the different cohesive energies involved, wherein Ga—N is 2.24 eV, In—N is 1.93 eV, Ga—As is 1.63 eV, and In—As is 1.55 eV. Based on the above, it is suggested that the tendency to reduce the high strain in the final grown InAsN layers is the physical origin for the remaining N atoms, since according to cohesive energy considerations, Ga—N and In—As bonding is preferred to In—N and Ga—As bonding [Albrecht, M. et al., *Phys. Rev. Lett.*, 99, 206103, 2007; and Kong, X. et al., *Appl. Phys. Lett.*, 87, 171901, 2005].

Example 4

Effect of Strain on N/As Exchange

The effect of strain on the neighboring III atomic layers on the N/As exchange was studied by reducing the strain in these atomic layers. A less-strained ALE GaInAsN quantum well, with 56 Å and 18% indium, characterized in terms of thickness and composition, was grown for this purpose.

The sample of GaInAsN quantum well was grown with TMGa and TMIn inserted together into the reactor chamber during the initial ALE growth stage, followed by a second stage of flowing DMH or $AsH_3$ introduced alternately. A significantly smaller amount of 0.1% N was detected for this sample by TOF-SIMS measurements. The measured PL wavelength of 922 nm shows a negligible red shift of the spectra with respect to a zero-nitrogen-content GaInAs quantum well. This result supports the suggested mechanism that strain in the (Ga)InAsN layer determines the final degree of nitrogen incorporation. Introduction of gallium and indium in sequence, for example [Ga—N—In—N—In—N—Ga—As], will maintain the strain at sufficient levels due to the indium, hence a four-monolayer of GaInAsN quantum well with 1.25% N has been demonstrate.

Example 5

Effect of Temperature on N/As Exchange

The effect of the temperature on the exchange of N/As was studies by growing a two-monolayer InAsN quantum well without the low-temperature GaAs cap-layer.

The low-temperature GaAs cap layer was grown at the same temperature as the ALE growth, and the N/As exchange took place at 650° C. compared with 500° C. in the other examples presented hereinabove.

The PL spectra of samples with and without cap layers are shown in FIG. 6C. The increased exchange temperature reduced the measured red shift with respect to the reference InAs quantum well from 75-95 meV to less than 30 meV, indicating a much lower rate of N incorporation. For simplicity, the N/As exchange can be described as being composed of two processes: the "in-out" diffusion of As and N from the N atomic layer, and an activation barrier process for exchange that involves desorption of the N atoms. In both temperatures, namely 500° C. and 650° C., almost complete atomic layers of As and N is "in-out" by diffusion, so it can conclude that diffusion is not the dominant process. However, the temperature would strongly influence the activation barrier process, and thus influence the desorption rate of nitrogen to a notable extent. Therefore, it appears that the process that controls the N/As exchange at higher temperatures is the desorption rate that eventually determines the amount of N replaced and/or remaining in the layer.

Example 6

A Highly Strained InAsN/GaAs Short-Period Superlattice

To demonstrate the applicability of the strain-controlled ALE, a 32 Å thick short-period superlattice consisting of three [In—N—In—As] quantum well units were grown, supported by approximately two 6 Å thick GaAs layers (nominal) that reduced the total strain and prevented the quantum well exceeding the critical thickness. The same growth conditions described hereinabove were used for the growth of the InAsN two-monolayer quantum well.

Figure 7:
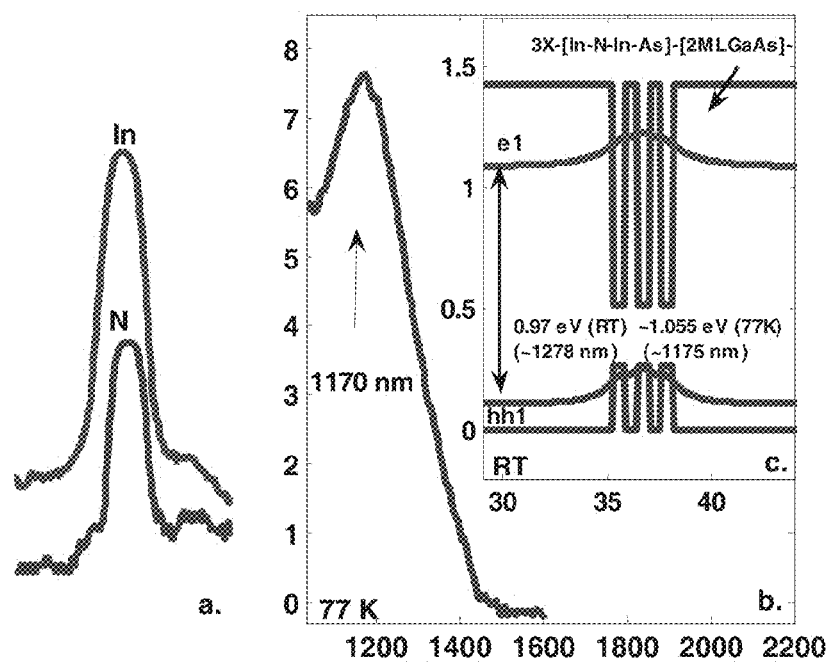
FIGS. 7A-C present the result of a TOF-SIMS measurements obtained from an exemplary indium-nitride InAsN/GaAs short-period superlattice grown by an ALE process according to some embodiments of the present invention and showing the concentration profiles of indium and nitrogen (FIG. 7A), the photoluminescence spectrum at 77° K of an InAsN/GaAs short-period superlattice structure grown by an ALE process according to some embodiments of the present invention (FIG. 7B), and a schematic band-gap structure and calculated fundamental e1 to hh1 transition energy of an exemplary InAsN/GaAs short-period superlattice grown by an ALE process according to some embodiments of the present invention.

FIG. 7A presents the TOF-SIMS profile of the indium and nitrogen content in the short-period superlattice structure. FIG. 7B shows the PL spectrum of the structure at 77 K. A schematic short-period superlattice band diagram and the to fundamental calculated e1-hh1 exciton transition are shown in FIG. 7C.

Considering the growth accuracy, there is an agreement between the calculated and the measured wavelengths emitted from the short-period superlattice, 1170 and 1175 nm, respectively. The obtained energy gap of 1.055 eV indicates that useful structures based on InAsN units as building blocks can be designed and implemented for optical communication wavelengths at room temperature.

Example 7

Five-Component Quantum Well

Five component alloys quantum wells, such as of GaIn-AsSbN on GaAs which are used for advanced optical communication lasers, were fabricated by MOCVD in a controlled ALE process according to some embodiments of the present invention, using precursors for GaSb(As) to effect strain in a GaAs substrate in order to promote nitrogen incorporation therein.

ALE growth per cycles of (Ga—Sb—Ga—N), wherein the nitrogen incorporation was driven by the strain built in the GaSb(As) layers, were performed on the substrate. Combination with the ALE grown InAs(N) units resulted in a total of five-component alloy formed by the sequence (In—N—In—As)-(Ga—Sb—Ga—N). GaAs spacers followed the InAs(N) quantum well or the Ga(As)SbN layer were used to reduce total strain and prevent overshooting the optimal thickness.

Figure 8:
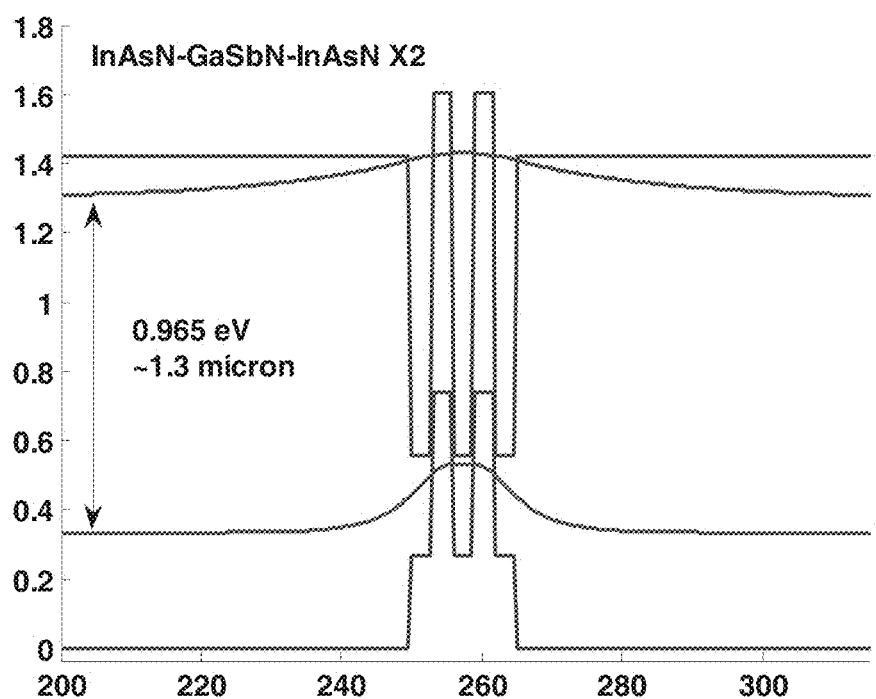
FIG. 8 presents room temperature energy band calculations, conducted for an exemplary strain controlled ALE grown quantum well structure of GaInAsSbN, showing an example for optical communication device based on this structure, wherein the short-period superlattice structure consisting of 2 periods of InAsN—GaSbN—InAsN units and each unit is 9 Å thick with 1.25% nitrogen

Preliminary results demonstrating experimentally the feasibility to grow such structures are shown in FIG. 8.

FIG. 8 presents energy band calculations conducted for an exemplary strain controlled ALE grown quantum well structure of GaInAsSbN, showing an example for optical communication device based on this structure, wherein the short-period superlattice structure consisting of 2 periods of InAsN—GaSbN—InAsN units and each unit is 9 Å thick with 1.25% nitrogen.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A quantum well structure comprising a base-layer, a well-layer which comprises a group-III element selected from the group consisting of In and Ga, a group-V element selected from the group consisting of N, P, As and Sb, and a cap layer, wherein a thickness of said well-layer ranges from 5 Å to 7 Å and a number of atoms of said group-III element is at least 50 percents of the total number of atoms of said well-layer.

2. The quantum well structure of claim 1, having a thickness that ranges from 10 Å to 20 Å.

3. The quantum well structure of claim 1, wherein a number of nitrogen atoms ranges from 0.1 percent to 5 percents of the total number of atoms of said well-layer.

4. The quantum well structure of claim 1, wherein a peak of a photoluminescent (PL) spectrum obtained therefrom is wider than a peak of a photoluminescent (PL) spectrum obtained from a quantum well which comprises said base-layer and a well-layer which comprises said group-III element and said group-V element and is devoid of nitrogen, and said cap layer, by at least 5%.

5. The quantum well structure of claim 4, wherein said peak of said photoluminescent (PL) spectrum obtained therefrom is wider than said peak of said photoluminescent (PL) spectrum obtained from said quantum well which comprises said base-layer and said well-layer which comprises said group-III element and said group-V element and is devoid of nitrogen, and said cap layer, by less than 100%.

6. The quantum well structure of claim 1, forming a part of a superlattice structure having a plurality of periods, each period independently comprises said well-layer and said cap-layer.

7. The quantum well structure of claim 6, wherein a number of periods in said superlattice structure ranges from 2-6.

8. The quantum well structure of claim 6, wherein said superlattice structure is configured as an optical device.

9. The quantum well structure of claim 8, wherein said optical device characterized by a concerted emission of radiation in a wavelength that ranges from 1.3 μm to 1.6 μm.

10. A superlattice structure comprising at least one quantum-well structure of claim 1.

11. The superlattice structure of claim 10, comprising a plurality of said quantum-well structures.

12. The superlattice structure of claim 10, characterized by a concerted emission of radiation in a wavelength that ranges from 1.3 μm to 1.6 μm.

13. The superlattice structure of claim 10, wherein each of said at least two periods has a thickness that ranges from 10 Å to 20 Å.

14. An optical device comprising the superlattice structure of claim 10.

15. The device of claim 14, being configured as a laser light source characterized by a wavelength that ranges from 1.3 μm to 1.6 μm.

16. The device of claim 14, forming a part of a data communication system.

17. An optical communication system comprising the superlattice structure of claim 10.

18. The system of claim 17, configured to use a laser light source characterized by a wavelength that ranges from 1.3 μm to 1.6 μm.

19. A light detection and/or transmission device comprising the superlattice structure of claim 10.

20. The light detection and/or transmission device of claim 19, being selected from the group consisting of an imaging system, a quantum teleportation system, a quantum cryptography system, a quantum computer and a target-analyzing system.

* * * * *